United States Patent [19]

Tamamura et al.

[11] Patent Number: 4,608,129
[45] Date of Patent: Aug. 26, 1986

[54] POLYMER FILM WITH CONDUCTIVE PATTERN AND METHOD OF MANUFACTURING THE SAME

[75] Inventors: Toshiaki Tamamura, Katsuta; Osamu Niwa, Mito; Makoto Hikita, Mito; Akio Sugita, Mito, all of Japan

[73] Assignee: Nippon Telegraphy and Telephone, Tokyo, Japan

[21] Appl. No.: 736,491

[22] Filed: May 21, 1985

[30] Foreign Application Priority Data

May 22, 1984 [JP] Japan .................. 59-101676
Jun. 4, 1984 [JP] Japan .................. 59-113095
Jul. 27, 1984 [JP] Japan .................. 59-155605
Dec. 7, 1985 [JP] Japan .................. 59-257395

[51] Int. Cl.$^4$ ............................................. B44C 1/04
[52] U.S. Cl. .................... 204/18.1; 204/130; 204/157.6; 204/59 R
[58] Field of Search .......... 204/18.1, 181.1, 4, 204/59 R, 130, 157.6

[56] References Cited

U.S. PATENT DOCUMENTS

| | | |
|---|---|---|
| 4,043,879 | 8/1977 | Levinos .................. 204/18.1 |
| 4,188,212 | 2/1980 | Fujiwara et al. ........ 204/18.1 |
| 4,304,465 | 12/1981 | Diaz . |
| 4,401,545 | 8/1983 | Naarmann et al. . |
| 4,442,185 | 4/1984 | Skotheim . |
| 4,468,291 | 8/1984 | Naarmann et al. . |
| 4,487,667 | 12/1984 | Traynor . |
| 4,488,943 | 12/1984 | Skotheim . |
| 4,488,987 | 12/1984 | Hocker et al. . |
| 4,490,509 | 12/1984 | Kossmehl et al. . |
| 4,522,691 | 6/1985 | Suginoya et al. ........ 204/181.1 |

Primary Examiner—R. L. Andrews
Attorney, Agent, or Firm—Townsend & Townsend

[57] ABSTRACT

A polymer film with a conductive electrode has an insulated polymer film with an electrically conductive pattern containing an electrically conductive polymer of an aromatic compound, the conductive pattern being formed on at least one major surface of the insulated film, and an internal portion extending from the at least one major surface.

12 Claims, 20 Drawing Figures

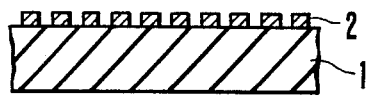
FIG.2
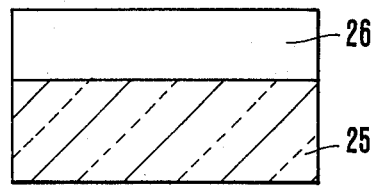
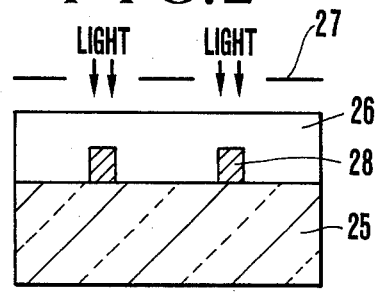
FIG.3A       FIG.3B
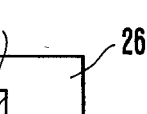
FIG.3C
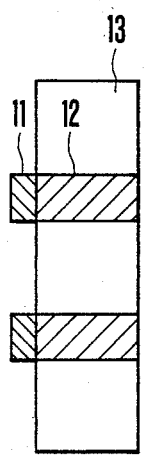     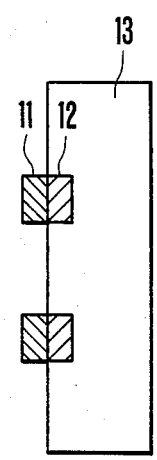
FIG.4       FIG.5

POLYMER FILM WITH CONDUCTIVE PATTERN AND METHOD OF MANUFACTURING THE SAME

BACKGROUND OF THE INVENTION

The present invention relates to a polymer film with a conductive pattern and a method of manufacturing the same.

Strong demand has recently arisen for digital display devices (e.g., liquid crystal display devices), touch-pen type manual input devices and facsimile systems. Polymer films with conductive patterns at low cost have been demanded for a connector (e.g., for electrode connections in a terminal block for a liquid crystal display device and an electrochromic display device, input connections for a touch pen, or output connections of an image sensor in the facsimile system) of an input/output part of the indoor devices described above have been demanded in favor of simple pattern formation.

Polymer films with conductive patterns used for the above purposes are selected from films obtained by mixing an electrically conductive filler in different thermoplastic resins and a film obtained by depositing, spraying or plating an electrically conductive material on a polymer film. It is easy to obtain uniform conductivity in these conventional films. However, in order to obtain a polymer film with a conductive pattern, a suitable patterning process was required.

SUMMARY OF THE INVENTION

It is, therefore, a principal object of the present invention to provide an improved polymer film with a conductive pattern and a method of manufacturing the same.

It is another object of the present invention to provide a polymer film with a conductive pattern and a method of manufacturing the same, wherein an increase in resistance of an electrically conductive portion can be prevented.

It is still another object of the present invention to provide a polymer film with a conductive pattern and a method of manufacturing the same without performing a special treatment in advance.

It is still another object of the present invention to provide a conductive-patterned polymer film having a high transmittance and a method of manufacturing the same.

In order to achieve the above objects, according to an aspect of the present invention, there is provided a polymer film with a conductive pattern comprising an insulated polymer film with an electrically conductive pattern containing an electrically conductive polymer of an aromatic compound, the conductive pattern being formed on at least one major surface of the insulated film and an internal portion extending from the at least one major surface.

According to another aspect of the present invention, there is provided a method of manufacturing a polymer film with a conductive pattern, comprising the steps of:

forming an insulated polymer film on a major surface of an electrode for acting as a patterned electrode;

causing an electrolytic solution and an aromatic compound to reach the major surface of the electrode through the polymer film; and electrochemically polymerizing aromatic compound molecules at an interface between the electrode and the polymer film to form an electrically conductive pattern made of electrochemically polymerized material of aromatic compound from the interface of the polymer film to inside the insulated polymer film.

BRIEF DESCRIPTION OF THE DRAWINGS

FIG. 2 is a sectional view showing a polymer film with a conductive pattern according to another embodiment of the present invention;

FIGS. 3A to 3C are respectively sectional views for explaining the steps in manufacturing a polymer film with a conductive pattern according to still another embodiment of the present invention;

FIGS. 4 and 5 are sectional views showing polymer films with conductive patterns according to other embodiments of the present invention, respectively;

DESCRIPTION OF THE PREFERRED EMBODIMENTS

Figure 1A:
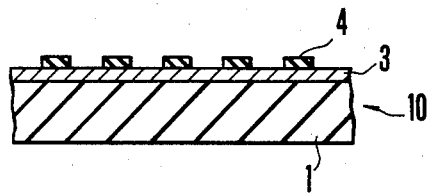
FIGS. 1A to 1D are respectively sectional views for explaining the steps in manufacturing a polymer film with a conductive pattern according to the present invention.
Figure 1B:
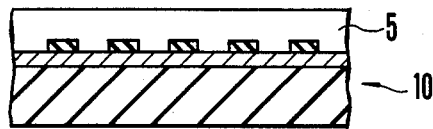
Figure 1C:
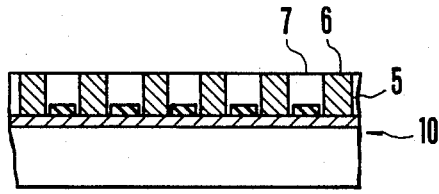
Figure 1D:

FIGS. 1A to 1D show a polymer film with a conductive pattern of the present invention and the principle of the method of manufacturing the same. Referring to FIGS. 1A to 1D, reference numeral 1 denotes an insulating substrate; 3, an electrically conductive layer formed on the entire surface of the insulating substrate 1; 4, an insulating pattern; 5, a polymer film; 6, an electrically conductive portion; and 7, an insulating portion.

As shown in FIG. 1A, the electrically conductive layer 3 is formed on the insulating substrate 1. The insulating layer 4 with a desired pattern is formed by lithography on the electrically conductive layer 3. The insulating substrate 1, the electrically conductive layer 3 and the insulating pattern 4 constitute an electrode substrate 10. In this case, the electrically conductive layer comprises a metal (e.g., gold, platinum, palladium, chromium or titanium) or an electrically conductive metal oxide (e.g., tin oxide or indium oxide) or semiconductor. The insulating pattern 4 comprises a resist film, an insulating oxide (e.g., SiO or $SiO_2$) or a nitride (e.g., $Si_3N_4$ or BN).

The insulated polymer film 5 is coated on the electrode substrate 10 by a proper method such as casting, spin coating or a doctor blade method.

The insulated polymer film used in the present invention is selected from a polyvinyl chloride resin (i.e., polyvinyl chloride or a copolymer of vinyl chloride with other vinyl monomer), a polyvinylidene chloride resin (i.e., polyvinylidene chloride or a copolymer of vinylidene chloride with other vinyl monomer), a polyvinylidene fluoride resin (i.e., polyvinylidene fluoride or a copolymer of vinylidene fluoride with other vinyl monomer), a polystyrene resin (i.e., polystyrene or a copolymer of styrene with other vinyl monomer), an acrylic resin (i.e., polymethylacrylate or a copolymer of other acrylic monomer with other vinyl monomer), polyvinyl carbazole, a copolymer of vinyl carbazole with other vinyl monomer, a copolymer of ethylene with other vinyl monomer, polyvinyl acetate, a copolymer of vinyl acetate with other vinyl monomer, other polyvinyl alcohol, other polycarbonate, polyetherimide, other polyether sulfonate, other polyamide-imide, other nylon, other phenol resin, other polybutadiene rubber, ethyl cellulose, cellulose acetate, and cellulose nitrate.

Additives such as a plasticizer, a heat stabilizer, a lubricant, an ultraviolet absorber, a defogging agent, a pigment, a dye, a surfactant, an electrically conductive filler and the like may be added to the polymer materials described above.

A current flows between the electrically conductive layer 3 of the electrode substrate 10 and a counter electrode (not shown) located to oppose the electrode substrate 10 in an electrochemical polymerization solution to form an electrically conductive pattern made of an electrochemically polymerized aromatic polymer material on only the electrically conductive portion of the electrode.

An aromatic compound subjected to electrochemical polymerization can be selected from the group consisting of pyrrole, 3-methylpyrrole, N-methylpyrrole, thiophene, furan, phenol, thiophenol, selenophene, tellurophene, biphenyl, azulene, p-terphenyl, o-terphenyl, p-quaterphenyl, 2-hydroxybiphenyl, diphenylsulfide, 2-($\alpha$-thienyl)thiophene, 2-($\alpha$-thienyl)furan, 2-(2-pyrrolyl)pyrrole, 2-(2-pyrrolyl)thiophene, 2-phenylthiophene, $\alpha$-thienylphenyl ether, $\beta$-furyl-$\alpha$-thienylselenide, 2-(2-pyrrolyl)selenophene, 2-(2-selenienyl)tellurophene, N-vinylcarbazole, N-ethynylcarbazole, methylazulene and pyrene.

A compound such as an organic quaternary ammonium salt, protonic acid or an inorganic salt is used as an electrolyte in electrochemical polymerization. As a solvent for dissolving an aromatic compound to be electrochemically polymerized, an acetonitrile, benzonitrile, or propylene carbonate based solution is normally used and the solvent composition is adjusted in accordance with the type of insulated polymer film to be rendered electrically conductive. This selection must be made such that an aromatic compound and electrolytic anions are diffused in the film to progress polymerization without dissolving the insulated polymer film.

The polymer film is peeled to obtain a polymer film having a desired electrically conductive pattern.

When the conductive and insulating patterns are formed on the electrode in order to obtain the electrically conductive film in the manner as described above, an insulated polymer film portion which contacts the electrically conductive portion of the electrode is made conductive. Another insulated polymer film portion which contacts the insulating portion of the electrode is kept insulative.

In this process, the entire film can be easily peeled from the electrode. Once the pattern is formed on the electrode surface, the electrode can be repeatedly used. In addition, when the electrode comprises a drum, the film with a conductive pattern can be continuously formed at low cost.

In electrochemical polymerization of an aromatic compound on the electrode coated with an insulated film, both major surfaces or one major surface (the surface contacting the electrode surface) of the film can be made conductive in accordance with polymerization conditions.

The present invention will be described in detail by way of examples. According to the present invention, the type of pattern, an insulated film material, a structure of the electrically conductive film can be modified to provide a virtually indefinite number of combinations. For example, as shown in FIG. 1, the electrically conductive pattern is formed entirely from the upper surface to the lower surface of the film along the direction of thickness thereof. However, this conductive pattern can be formed from one surface of the film to a certain depth. Therefore, the present invention is not limited to the following examples.

EXAMPLE 1

A 1,000-Å indium oxide film was sputtered on a glass substrate. A one-dimensional grating pattern was formed on the electrically conductive substrate having the indium oxide layer thereon in the following manner. A 2-$\mu$m photoresist AZ-1350J (Shipley Corp.) was spin coated on the indium oxide layer and was exposed with a photomask having a one-dimensional grating pattern with 0.1-mm wide stripes separated by 0.1-mm wide spaces. A 2,000-Å SiO film was deposited to the exposed photoresist film and was lifted off in methyl ethyl ketone to prepare an SiO pattern as an insulating layer having a 0.1-mm width at 0.2-mm pitches on the indium oxide layer.

Casting was performed using a solution of polyvinyl chloride (molecular weight: 700,000) in methyl ethyl ketone to obtain a 20-$\mu$m film on the substrate. The substrate with the film was dipped in an electrolytic solution obtained by dissolving 0.3 mol/l of tetraethylammonium paratoluenesulfonate and 1 mol/l of pyrrole in an acetonitrile-methyl ethyl ketone (1:1) solvent mixture. In this case, a titanium mesh plated with platinum was used as the counter electrode. Electrochemical polymerization of pyrrole was performed at a voltage of 3.0 V for 10 minutes, thereby precipitating black polypyrrole. The resultant film could be easily peeled from the electrode. An electrical conductivity of the film was measured to be as high as 4.5 S/cm along a direction parallel to the stripes of the electrode. However, a portion of the film had an insulating property of $10^{-13}$ S/cm or less in a direction perpendicular to the stripes. As a result, an electrically insulated film with high anisotropy was prepared.

EXAMPLE 2

After 100-Å chromium and 700-Å platinum were deposited on a glass substrate, respectively, a 500-Å ITO (indium-tin oxide) was sputtered on the resultant structure to prepare an electrically conductive substrate. A 2-$\mu$m photoresist AZ-1350J (Shipley Corp.) was spin coated on the ITO layer and was exposed with a photomask having a two-dimensional grating pattern having 50-$\mu$m pitches. The exposed photoresist film was developed, and then a 2,000-Å silicon oxide (SiO) film was deposited thereon. The lift-off was performed in the methyl ethyl ketone solution.

A two-dimensional pattern of the SiO layer as the insulating layer was formed on the electrically conductive ITO layer. Conductive island regions at an interval of 50 $\mu$m were formed on the surface of the ITO layer. A 15-$\mu$m vinylidene chloride-vinyl chloride (75:25) copolymer film was coated by casting on the substrate. The substrate with the film was dipped in an acetonitrile-tetrohydrofuran (2:1) solution containing thiophene (1 mol/l) and tetraethylammonium perchlorate (0.3 mol/l). A titanium mesh electrode plated with platinum was also dipped in this solution to perform electrochemical polymerization of thiophene at a voltage of 4.0 V for 10 minutes. As a result, green polythiophene was precipitated, and its film was peeled from the electrode substrate. An electrical conductivity of a portion as the upper surface of the film was $10^{-12}$ S/cm or less and regarded as an insulating property. An electrical conductivity of the film along the direction of thickness thereof was as high as 1.5 S/cm. As a result, a film having conductivity only along the direction of thickness was prepared.

An electrode resistance is one of the polymerization parameters. When an electrode substrate having a low resistance is used, the two major surfaces of the film can be easily made conductive. However, when an electrode substrate having a high resistance is used, only one major surface described above can be easily made conductive. By utilizing this property, when an electrode substrate having a low-resistance portion and a high-resistance portion is used, a lower surface of the film which contacts the electrode surface is entirely made conductive. However, in the surface which contacts with the electrochemical polymerization solution, only the low-resistance portion is made conductive.

Such an example will be described in Example 3.

EXAMPLE 3

After 100-Å chromium and 1,000-Å gold were deposited on a glass substrate, respectively, a 2,000-Å ITO layer was deposited thereon. A 2-μm photoresist AZ-1350J was spin coated on the ITO layer and was exposed with a photomask to form a one-dimensional stripe pattern having stripes of 50 μm separated by spaces of 50 μm. The photoresist film was then developed, and the ITO layer was etched for 1,200 Å in a parallel-plate type reactive ion etching apparatus using an etchant of $CBrF_3$ at a flow rate of 20 SCCM, a pressure of 20 mTorr and a power of 100 W. When the residual AZ photoresist film was removed by a plasma asher apparatus, an electrode substrate was prepared wherein ITO oxide layers having thickness of 800 Å and 2,000 Å were alternately formed on the gold layer at intervals of 50 μm.

A 20-μm polyvinyl chloride (molecular weight:70,000) film was formed by casting on the resultant electrode substrate. Electrochemical polymerization of pyrrole was performed for the electrode with the film in the same manner as in Example 2. Polypyrrole was precipitated on the entire surface of the film. The polypyrrole film could be easily peeled from the electrode substrate. A surface of the film which contacted the electrode substrate had a high electrical conductivity of 12 S/cm in a direction parallel to the one-dimensional stripe pattern and a high electrical conductivity of 8.5 S/cm in a direction perpendicular thereto. However, a surface of the polypyrrole film which contacted the electrolytic solution had a high conductivity of 6.8 S/cm in a direction parallel to the stripes but had an insulation of $10^{-12}$ S/cm or less in the direction perpendicular thereto. In this manner, when the electrically conductive patterns having different resistivities were formed on the electrode surfaces and the electrochemical polymerization conditions were properly selected, one surface was made entirely conductive, and the other surface had an anisotropic conductivity pattern.

As described above, a polymer film is coated on an electrode with a desired electrically conductive pattern, and an aromatic compound is electrochemically polymerized to obtain a polymer film having the same pattern as the electrically conductive pattern of the electrode, thereby easily manufacturing a film having anisotropic conductivity or a special electrically conductive pattern.

The resultant films can be used in a variety of applications for components such as patterned electrically conductive layers of two-dimensional input devices, input terminals of display elements and output terminals of image sensors.

Referring to FIG. 1, the electrically conductive pattern constituting the electrode substrate 10 is obtained such that the insulated pattern 4 is formed on the electrically conductive layer 3. However, as shown in FIG. 2, an electrically conductive pattern 2 may be directly formed on an insulating substrate 1. In addition, the electrode with the conductive pattern described above may comprise a drum-like structure for continuously forming a polymer film with a conductive pattern.

A simplified electrode structure for forming a film with a conductive pattern will be described hereinafter. A material such as a semi-insulating semiconductor material is used wherein a high electrical resistance is given in a dark state without light exposure but the surface resistance is decreased, so that a portion subjected to light exposure can be made conductive. Therefore, the portion subjected to light exposure is limited to obtain a polymer film having a desired conductive pattern.

The above technique is illustrated in FIGS. 3A to 3C. Referring to FIGS. 3A to 3C, an insulated polymer film 26 is coated on a major surface of a semi-insulating semiconductor substrate 25 serving as an electrode substrate. When the substrate 25 with the insulated polymer film 26 is irradiated with light using a pattern mask 27, a current required for electrochemical polymerization flows in only the exposed portion, thereby obtaining an electrically conductive area (indicated by hatched lines) in the polymer film 26. Thereafter, the polymer film 26 is peeled from the electrode to prepare a polymer film with a conductive pattern shown in FIG. 3C.

According to this method, the flat surface of the electrode can be used, and the patterning of electrode substrate is not necessary. In addition, the resultant film can be easily peeled from the electrode, because of no pattern on the electrode.

The above embodiment will be described in detail by way of examples. However, the present invention is not limited to these examples.

EXAMPLE 4

When 1-μm amorphous silicon was deposited by CVD on a stainless steel plate, the amorphous silicon film had a resistivity of about $10^8$ Ωcm in a dark state. 1-μm polyvinyl chloride was spin coated on the amorphous silicon film. An insulating rubber resin was coated on a surface of the stainless steel plate which did not have the amorphous silicon film thereon.

The resultant substrate was dipped together with a platinum counter electrode in an electrolytic solution obtained by dissolving 0.3 mol/l of tetraethylammonium paratoluenesulfonate and 1 mol/l of pyrrole in an acetonitrile-tetrahydrofuran (2:1) solvent mixture. A voltage of 1.2 V was applied between the film coated with the polyvinyl chloride film and the platinum counter electrode.

An argon laser beam having a spot diameter of 50 μm irradiated the amorphous silicon substrate through the polyvinyl chloride for 50 stripes with a pitch of 200 μm at a scan speed of 1 m/min. As a result, a polypyrrole was formed in the irradiated area, and a polymer film having the polypyrrole or conductive pattern was obtained.

The resultant film was peeled from the amorphous silicon substrate. An electrical conductivity of the film was measured by a 4-terminal method in a direction parallel to the polypyrrole stripes to obtain a high conductivity of 10 S/cm. However, when an electrical conductivity of the film was measured in a direction perpendicular to the polypyrrole stripes, an insulating property was given as $10^{-8}$ S/cm or more.

EXAMPLE 5

An amorphous silicon film was deposited on a stainless steel plate, polyvinyl chloride was coated on the amorphous silicon film with a thickness of about 1 μm, and an insulating rubber resin was coated on a surface of the stainless steel plate which did not have the amorphous silicon film thereon, thereby obtaining a substrate in the same manner as in Example 4.

A photomask having a stripe pattern with a 50-μm width and a 200-μm pitch was brought into contact with the polyvinyl chloride coated on the substrate. The substrate with the photomask was dipped together with a platinum counter electrode in an electrolytic solution obtained by dissolving 0.3 mol/l of tetraethylammonium paratoluenesulfonate and 1 mol/l of pyrrole in an acetonitrile-tetrahydrofuran (2:1) solvent mixture. A voltage of 1.6 V was applied between the film coated with the polyvinyl chloride film and the platinum counter electrode.

Light from a high-voltage mercury lamp irradiated the polyvinyl chloride film for 100 seconds to grow a polypyrrole pattern in the polyvinyl chloride film, thereby preparing a polymer film with a conductive pattern.

The resultant film was peeled from the amorphous silicon substrate. An electrical conductivity of the film was measured to be as high as 20 S/cm by a 4-terminal method in a direction parallel to the polypyrrole stripes. However, when an electrical conductivity of the film was measured in a direction perpendicular to the polypyrrole stripes, an insulating property was given as $10^{-8}$ S/cm or more.

According to the present invention as described above, a polymer film was coated on a substrate whose electrical resistance is decreased upon light exposure, and light irradiates the film in a desired pattern. The exposed portion is used as an electrode, and electrochemical polymerization is performed, thereby easily preparing a film having anisotropic conductivity or a special conductive circuit pattern.

The film with the conductive pattern described above comprises a hybrid structure of an insulating polymer and an electrically conductive polymer, so that the electrical conductivity is degraded as compared with the electrochemical polymer. When an electrically conductive pattern becomes narrow, its electrical resistance is increased. In this sense, a range of applications of the film is often limited.

In order to solve this problem, an electrically conductive portion is obtained by laminating an electrically conductive layer made of an electrochemically polymerized aromatic compound and a layer obtained by mixing an electrochemically polymerized aromatic compound in an insulated polymer film.

FIGS. 6A to 6E are sectional views for explaining the steps in manufacturing a polymer film having an electrically conductive pattern.

Figures 6A, 6B, 6C:
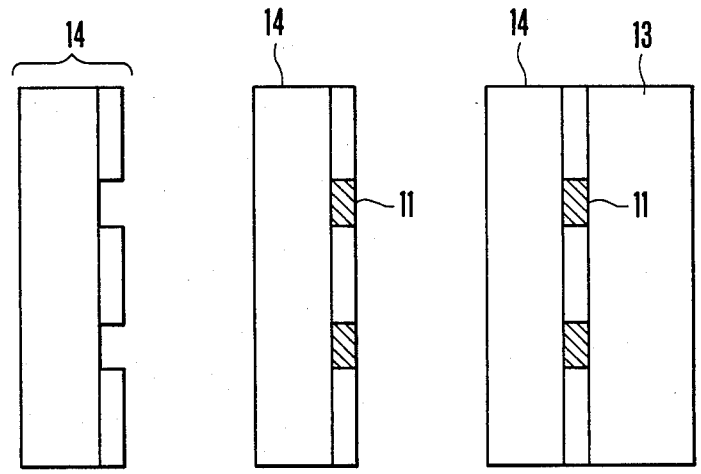
FIGS. 6A to 6E are respectively sectional views for explaining the steps in manufacturing the pattern of FIG. 5.

As shown in FIG. 6A, an electrode substrate 14 is dipped together with a counter electrode in an electrochemical polymerization solution of an aromatic compound. A DC voltage is applied between the electrode substrate 14 and the counter electrode. An electrochemical polymer layer 11 of an aromatic compound is formed in correspondence with the conductive electrode pattern (FIG. 6B). The electrode substrate 14 shown in FIG. 6A is constituted by the insulating substrate of FIG. 1A, the electrically conductive layer formed thereon and the insulating pattern formed on the electrically conductive layer. Alternatively, as shown in FIG. 2, the electrode substrate may be constituted by the electrically conductive layer directly formed on the insulating substrate.

Figures 6D, 6E:
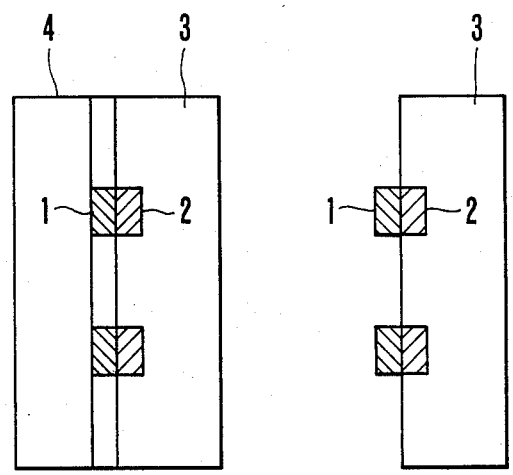

Subsequently, an insulated polymer film 13 is formed on the electrode substrate (FIG. 6C). The electrode substrate with the film is dipped in an electrochemical polymerization solution again to perform electrochemical polymerization of an aromatic compound. An electrochemical polymer is grown from an insulated polymer film portion contacting the single electrochemical polymer layer formed in the electrically conductive pattern of the electrode substrate and is formed in the insulated polymer film, thereby obtaining an electrically conductive polymer layer 2 (FIG. 6D). In this case, when electrochemical polymerization is stopped at its early stage, a film with an electrically conductive pattern is formed on only one major surface, as shown in FIG. 5. However, when electrochemical polymerization is sufficiently performed, a film with electrically conductive patterns on both the major surfaces of FIG. 4 is obtained. The resultant film is peeled from the electrode substrate (FIG. 6E). The laminated conductive patterns have good adhesion strength, so that a single electrochemical polymer layer will not be removed from the insulated polymer film due to the following reason. After the insulated polymer film is adhered to the electrochemical polymer layer, electrochemical polymerization is started from the single electrochemical polymer layer, and the electrochemical polymers are bonded to each other.

FIGS. 4 and 5 show a polymer film structure having an electrically conductive pattern of the present invention. An electrically conductive pattern comprises a laminate of a single electrochemical polymer layer 11 of an aromatic compound and an electrically conductive polymer layer 12 obtained by combining the insulated polymer film material and the electrochemical polymer, and the electrically conductive pattern is formed in the insulated polymer film 13. The single electrochemical polymer layer 11 decreases the surface resistance of the electrically conductive pattern, and the polymer layer 12 increases adhesion strength between the single electrochemical polymer layer and the insulated polymer film and increases the thickness of the electrically conductive pattern. In addition, the insulated polymer film holds the electrically conductive pattern and increases the mechanical strength of the film. The polymer layer 12 comprises a layer which is entirely conductive as shown in FIG. 4 or a layer whose one surface is made conductive as shown in FIG. 5. Either type of polymer layer 12 can be used for a desired application.

Other examples of the present invention will be described hereinafter.

EXAMPLE 6

A chromium layer of 15 nm was deposited on a glass substrate having an ITO layer and a surface resistance of 10 Ω to prepare an electrode substrate. A 3.5-μm $SiO_2$ film was sputtered on the substrate. A 2-μm photoresist AZ-1350 (Shipley Corp.) was spin coated on the $SiO_2$ film. By using a photomask having a one-dimensional stripe pattern with a stripe width of 10 μm and a space of 40 μm between the stripes, the photoresist layer was exposed and developed to obtain a photoresist pattern. The $SiO_2$ film was etching by plasma etching using $CF_4$ gas as an etchant and the photoresist pattern as a mask. The photoresist pattern was then removed to form $SiO_2$ stripes on the chromium-ITO surface. The $SiO_2$ stripes had a width of 10 μm and formed at a rate of 50 stripes per millimeter.

A solution of pyrrole (1 mol/l) and tetraethylammonium paratoluenesulfonate (0.3 mol/l) in acetonitrile-nitrobenzene (4:1) was prepared as an electrochemical polymerization solution. The resultant electrode substrate as an anode and a platinum-plated titanium mesh electrode as a cathode were dipped in the above solution. A DC voltage of 2 V was applied between the cathode and the anode while a charge density was kept at 0.6 coulomb/cm$^2$, thereby performing electrochemical polymerization of pyrrole and hence obtaining polypyrrole having a thickness of 2 μm and not covered with $SiO_2$. A methyl ethyl ketone solution of polyvinyl chloride (molecular weight: 70,000) was casted on the polypyrrole film having a thickness of 2 μm, thereby forming a polyvinyl chloride film having a thickness of 20 μm. The electrode substrate with the film was dipped together with a platinum-plated titanium mesh electrode in the electrolytic solution of pyrrole. A DC voltage of 1.5 V was then applied between the electrode substrate and the mesh electrode while a charge density of 0.15 coulomb/cm$^2$ was kept to perform pyrrole polymerization. The film after polymerization was washed with ethanol and dried. The dried film was peeled from the electrode substrate. The polypyrrole film which was first obtained was not left on the electrode substrate. The polyvinyl chloride film was strongly adhered with the patterned polypyrrole film. Upon peeling of the film, surface resistances of a surface (to be referred to as an electrode contact surface) of the film which contacted the electrode along the direction parallel to the stripes and perpendicular thereto were measured by a 4-terminal method. The surface resistances of the film along the parallel and vertical directions were 15 Ω and 20 MΩ or more, respectively.

As a comparative example, a polyvinyl chloride film having a thickness of 20 μm was directly formed on the electrode substrate used in the above embodiment. Electrochemical polymerization of pyrrole was performed on the electrode with the film at a voltage of 1.5 V and a charge density of 0.15 coulomb/cm$^2$. The surface resistances of the film along directions parallel to and perpendicular to the stripes were 3.5kΩ and 20 MΩ, respectively.

In the manner as described above, after the patterned polypyrrole film was formed on the substrate, a polymer film with a conductive pattern was formed on the polypyrrole film to decrease the surface resistance to be about 1/100.

EXAMPLE 7

A platinum film having a thickness of 20 nm was deposited on a glass substrate having a surface resistance of 10 Ω and an ITO layer. A 3-μm photoresist AZ-1350J (Shipley Corp.) was spin coated on the platinum film. The photoresist film was exposed by using a photomask having a one-dimensional pattern having a stripe width of 40 μm and a space of 10 μm between the adjacent stripes and was developed to obtain a photoresist pattern. A 2-μm SiO film was deposited to cover the entire surface of the substrate and was lifted off in methyl ethyl ketone, thereby obtaining a 50-stripes/mm SiO pattern having a stripe width of 10 μm.

An acetonitrile solution of thiophene (0.8 mol/l) and tetraethylammonium perchlorate (0.2 mol/l) was prepared as an electrochemical polymerization solution. The electrode substrate as an anode and a platinum-plated titanium mesh electrode as a cathode were dipped in the above solution. A DC voltage of 5 V was applied between the anode and the cathode while a charge density of 0.7 coulomb/cm$^2$ was kept to electrochemically polymerize thiophene, thereby forming a 1.8-μm polythiophene film on the platinum/ITO pattern. A cyclohexanone solution of polyvinylidene chloride was casted on the substrate to form a 30-μm polyvinylidene chloride film. The resultant electrode substrate with the film was dipped together with a platinum-plating titanium mesh electrode in the electrolytic solution of thiophene. A DC voltage of 3 V was applied between the electrode substrate and the mesh electrode while a charge density of 0.2 coulomb/cm$^2$ was kept to perform polymerization of thiophene. After polymerization, the film was washed with ethanol and dried. The dried film was peeled from the electrode substrate. The polythiophene film first formed was not left between the patterns on the electrode substrate. The polyvinylidene chloride film was strongly adhered with the polythiophene film. The peeled film was subjected to surface resistance measurement by a 4-terminal method. Surface resistances of the film along directions parallel and perpendicular to the stripes and the vertical direction were 130 Ω and 20 MΩ or more, respectively.

As a comparative example, a polyvinylidene chloride film having a thickness of 30 μm was formed directly on the same electrode substrate as this Example. On the electrode with the film, thiophene was electrochemically polymerized at a voltage of 3 V and a charge density of 0.2 coulomb/cm$^2$. The surface resistances of the resultant film along directions parallel and perpendicular to the stripes were measured to be 6.5 kΩ and 20 MΩ or more, respectively.

In this manner, after the patterned polythiophene film was formed, the polymer film with a conductive pattern was formed thereon to decrease the surface resistance of the patterned electrically conductive film to about 1/10.

EXAMPLE 8

An acetonitrile-nitrobenzene (4:1) solution of pyrrole (1 mol/l) and tetraethylammonium tetrafluoroborate (0.3 mol/l) was prepared as an electrochemical polymerization solution. An electrode substrate as an anode and a platinum-plated titanium mesh electrode as a cathode in the same manner as in Example 1 were dipped in the above solution. A DC voltage of 2 V was applied between the anode and the cathode while a charge density of 0.6 coulomb/cm$^3$ was kept to electrochemically polymerize pyrrole, thereby forming a 2-$\mu$m polypyrrole layer on the conductive portion on the electrode substrate. A tetrahydrofuran solution of polystyrene (molecular weight: 800,000) was casted on the surface of the substrate to obtain a polystyrene film having a thickness of 4.5 $\mu$m. The resultant substrate with the film was dipped together with a platinum-plated titanium mesh electrode in an electrolytic solution of pyrrole. A DC voltage of 1.5 V was applied between the electrode substrate and the titanium mesh electrode while a charge density of 0.3 coulomb/cm$^2$ was kept to electrochemically polymerize pyrrole. After polymerization, the film was washed with ethanol and dried. The dried film was peeled from the electrode. The polypyrrole film first formed on the electrode was not left between the patterns on the electrode substrate. The polystyrene film was strongly adhered with the patterned polypyrrole film. After peeling of the film, the surface resistances of the electrode contact surface of the film along directions parallel and perpendicular to the pattern were measured by the 4-terminal method to be 10 $\Omega$ and 20 M$\Omega$, respectively.

As a comparative example, a polystyrene film having a thickness of 15 $\mu$m was formed directly on the same electrode substrate as in this Example. Pyrrole was electrochemically polymerized on the electrode substrate with the film at a voltage of 1.5 V and a charge density of 0.3 coulomb/cm$^2$ to form a polymer film with a conductive pattern. The surface resistances of the electrode contact surface of the film along directions parallel and perpendicular to the pattern were measured to be 280 $\Omega$ and 20 M$\Omega$ or more, respectively.

As described above, after the patterned polypyrrole film was formed, the polymer film with a conductive pattern was formed thereon, thereby decreasing the surface resistance of the patterned electrically conductive film to about 1/10.

EXAMPLE 9

A gold film having a thickness of 15 nm was deposited on a glass substrate having a surface resistance of 10 $\Omega$ and an ITO layer to prepare an electrode substrate. An SiO$_2$ film was sputtered on the electrode substrate to a thickness of 5 $\mu$m. A 3-$\mu$m photoresist AZ-1350J (Shipley Corp.) was spin coated on the SiO$_2$ film. The photoresist film was exposed with a photomask having a circular pattern with a diameter of 50 $\mu$m at lateral and vertical intervals of 200 $\mu$m and was developed to obtain a photoresist pattern. The SiO$_2$ film was plasma etched by using the photoresist pattern as a mask and CF$_4$ gas as an etchant. After the photoresist pattern was removed, an SiO$_2$ layer having apertures each having the diameter of 50 $\mu$m was formed on the surface of the gold-ITO surface.

An acetonitrile-ethanol (4:1) solution of pyrrole (1 mol/l) and tetraethylammonium paratoluenesulfonate (0.3 mol/l) was prepared as an electrochemical polymerization solution. The electrode substrate as an anode and a platinum-plated titanium mesh electrode as a cathode were dipped in the solution. A DC voltage of 5 V was applied between the anode and the cathode while a charge density of 3 coulomb/cm$^2$ was kept to electrochemically polymerize pyrrole, thereby forming a 9-$\mu$m polypyrrole film on the electrode substrate. A dimethylformamide solution of polyvinylidene fluoride (molecular weight: 120,000) was casted on the electrode substrate to form a polyvinylidene fluoride film having a thickness of 12 $\mu$m. The substrate with the film was dipped together with a platinum-plated titanium mesh electrode in the electrolytic solution of pyrrole. A DC voltage of 3 V was applied between the electrode substrate and the mesh electrode while a charge density of 0.8 coulomb/cm$^2$ was kept to electrochemically polymerize pyrrole. After polymerization, the film was washed with ethanol and dried. The dried film was peeled from the electrode. In this case, the polypyrrole film first formed in a circular shape on the electrode was not left on the electrode. The polyvinylidene fluoride film was strongly adhered to the polypyrrole film. After peeling of the film, resistances of the surfaces of the film which contacted the electrode and the solution and the resistance of the film along a direction of thickness of the film were measured by the 4-terminal method. The surface resistances were 20 M$\Omega$ or more, and the resistance along the thickness direction were 25 $\Omega$, respectively. The film having conductivity only along the thickness direction was prepared.

As a comparative example, a polyvinylidene fluoride film having a thickness of 12 $\mu$m was directly formed on the same electrode substrate as in this Example. Pyrrole was electrochemically polymerized on the electrode substrate with the film at a voltage of 5 V and a charge density of 4 coulomb/cm$^2$ to prepare a polymer film with a conductive pattern. The surface resistances of the film which contacted the electrode and the solution and the resistance along the direction of thickness of the film were measured by the 4-terminal method. The surface resistances of the two surfaces were 20 M$\Omega$ or more, and the resistance along the thickness of the film were 55 $\Omega$. In this manner, the resultant film had conductivity only along the thickness direction.

As is apparent from the above description, after the circular polypyrrole pattern was formed, the polymer film with a conductive pattern was formed thereon. The resistance along the thickness direction can be decreased to about 1/10, thereby obtaining the film having conductivity only along the thickness direction.

According to the above embodiment, an electrochemical polymer layer of an aromatic compound was formed on the electrode having a predetermined electrically conductive pattern, and then an insulated polymer film was formed thereon to electrochemically polymerize the aromatic compound, thereby forming the insulated polymer film-electrochemically polymer layer. As a result, a polymer film having a low electrical resistance was prepared.

Figure 7A:
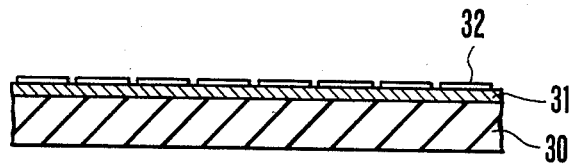
FIGS. 7A to 7D are respectively sectional views for explaining the steps in manufacturing a polymer film with a conductive pattern according to still another embodiment of the present invention.
Figure 7B:
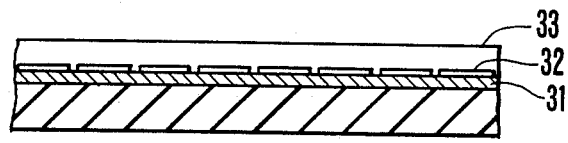
Figure 7C:
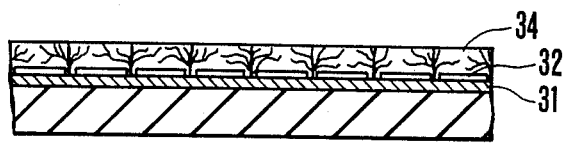
Figure 7D:
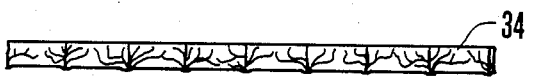
Figure 8:
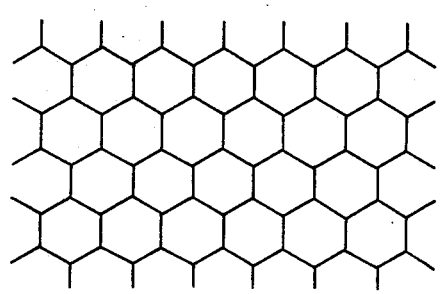
FIG. 8 is a plan view of the polymer film with the conductive pattern prepared by the steps in FIG. 1.

FIGS. 7A to 7D show still another embodiment of the present invention. Referring to FIGS. 7A to 7D, reference numeral 30 denotes an insulating substrate; 31, an electrically conductive layer for constituting an electrode; 32, an insulating pattern; 33, an insulated polymer film; and 34, a conductive polymer film. FIG. 8 shows an electrode pattern having regular linear conductive portions. Referring to FIG. 7A, the insulating pattern 32 is formed on the surface of the low-resistance electrode 31 formed on the insulating substrate 30 to leave linear gaps. The polymer film 33 is formed on the surface of the resultant structure, as shown in FIG. 7B. When the aromatic compound is electrochemically polymerized on the electrode substrate described above, an electrical current is concentrated in the gaps to progress electrochemical polymerization. As shown in FIG. 7C, the conductor paths reaching the film surface are formed. At the same time, electrochemical polymerization is slightly progressed in the lateral direction. Electrochemical polymerization is stopped after a proper period of time, and the polymer film 34 is removed from the electrode substrate, as shown in FIG. 7D. Although the portions near the gaps are made highly conductive, the intermediate portions are kept at low conductivity but have a high light transmittance. In other words, light transmissivity can be guaranteed in the film as a whole. In particular, when an antistatic transparent film is manufactured by using the above film, an internal object can be visually observed. The transmittance can be controlled by controlling the width of the gaps and their pitches, in addition to controlling the electrochemical polymerization conditions. The pitch must be optimized in consideration of a thickness of a film to be made conductive.

In order to obtain uniform electrical conductivity and uniform transmittance along a film surface, the gaps must be uniformly and regularly formed. For this purpose, a hexagonal or honeycomb structure (FIG. 8) or an octagonal structure is preferred.

When the current is to be concentrated, the gap width is less than 10 $\mu$m and more preferably 5 $\mu$m or less. The pitch between the gaps preferably corresponds to the thickness of the polymer film to be made conductive. Unless the pitch is at least 20 $\mu$m or more, a sufficiently high transmittance cannot often be obtained.

In order to form a linear conductive pattern, a photomask having the identical pattern as described above must be used. The pattern is transferred to the resist film to pattern the insulated film in accordance with a lift-off or etching technique. In order to obtain a gap having a width of 2.0 $\mu$m or less, electron beam exposure or X-ray lithography must be used.

Examples associated with the embodiment described with reference to FIGS. 7 and 8 will be described hereinafter.

EXAMPLE 10

A NESA glass substrate having a surface resistance of 10 $\Omega/cm^2$ was used as an electrode substrate. A 1.2-$\mu$m photoresist AZ-1350J (Shipley Corp.) was spin coated on the NESA glass substrate. The pattern having a stripe width of 2 $\mu$m and an interval of 18 $\mu$m, as shown in FIG. 8, was transferred to the photoresist film by using a photomask. The photoresist film was developed to obtain a photoresist pattern. A 0.25-$\mu$m SiO film was thermally deposited on the entire surface of the substrate. The SiO film was lifted off in an acetone solution to obtain the SiO islands forming a gap of about 2 $\mu$m.

An N,N-dimethylformamide solution of polyvinylidene fluoride was casted on the resultant structure to form a polyvinylidene fluoride film having a thickness of 20 $\mu$m.

An acetonitrile-ethyl alcohol (2:1) solution of pyrrole (1.2 mols/l) and tetraethylammonium tetrafluoroborate (0.3 mol/l) was prepared as an electrochemical polymerization solution.

The electrode substrate with the film was dipped together with a platinum-plated mesh counter electrode in the above solution. A voltage of 3 V was applied between the electrode substrate and the counter electrode for 2 minutes to electrochemically polymerize pyrrole.

After electrochemical polymerization, the film could be easily peeled from the electrode. A resistance of the film and its transmittance at a wavelength of 600 nm were measured. The results are summarized in Table 1.

TABLE 1

| Film Thickness | 20.5 to 21.2 $\mu$m |
| --- | --- |
| Surface resistance of upper Surface[*1] | 8.5 to 9.8 k$\Omega$/□ |
| Surface resistance of lower Surface[*1] | 4.3 to 4.5 k$\Omega$/□ |
| Resistance in direction of thickness | 1.2 to 1.6 k$\Omega$ |
| Transmittance (at 600 nm) | 68% |

[*1]The upper surface is defined as a surface of the film which contacts the electrode and the lower surface is defined as a surface which is opposite to the upper surface, and a square indicates 1 cm$^2$.

As is apparent from Table 1, an electrically conductive film had a low surface resistance and a high transmittance. This film also had conductivity along the direction of thickness thereof.

EXAMPLE 11

The same electrode as in Example 10 was used in Example 11. A solution of polyvinyl chloride in a tetrahydrofuran-methyl ethyl ketone solvent mixture was casted to form a film having a thickness of 35 $\mu$m.

The resultant substrate with the film was dipped together with a platinum-plated mesh counter electrode in an acetonitrile-nitrobenzene (1:1) solution of thiophene (1 mol/l) and tetraethylammonium perchlorate (0.3 mol/l). A DC voltage of 5.0 V was applied between the electrode substrate and the counter electrode for 2 minutes to electrochemically polymerize thiophene. The resultant film was easily peeled from the substrate. An electrical conductivity of the film and its transmittance at a wavelength of 600 nm were measured. The results are summarized in Table 2:

TABLE 2

| Film Thickness | 34.5 to 35.2 $\mu$m |
| --- | --- |
| Surface resistance of upper Surface[*1] | 16.9 to 18.1 k$\Omega$/□ |
| Surface resistance of lower Surface[*1] | 15.1 to 15.8 k$\Omega$/□ |
| Resistance in direction of thickness | 3.1 to 3.5 k$\Omega$ |
| Transmittance (at 600 nm) | 71% |

As is apparent from Table 2, even if a film thickness was increased to 35 $\mu$m, the film had conductivity along the direction of thickness thereof as well as along the film surfaces. In addition, this film had a high transmittance.

According to the examples described above, a polymer film is formed on the electrode having a regular linear conductive portion, and the aromatic compound is electrochemically polymerized, so that the conductive electrochemical polymer is immediately grown from the polymer film portion which contacts the linear conductive portion, thereby making the entire film conductive. The film portion contacting the linear portion is rendered highly conductive, but the film has a high transmittance when the electrochemical polymerization conditions are optimally set. The electrically conductive film having a high transmittance can be used as an antistatic preventing wrapping film, an input/output device transparent conductive film, or the like.

The present invention is not limited the embodiments described above. Various changes and modifications may be made within the spirit and scope of the invention.

In the above embodiments, a single polymer film is used as the insulated polymer film. However, the insulated polymer film may comprise a multilayer film having at least two polymer films. In this case, adhesion and conductivity are further improved.

A material to be removed from the polymer coated on the electrode substrate may be contained in the polymer. Before and/or during reaction of the electrochemical polymerization, this material may be removed to easily diffuse the electrolyte or aromatic compound. In this case, when the material is removed, microvoids are formed in the polymer film. For this reason, the electrolyte and aromatic compound can be easily diffused in the film, thereby increasing polymerization speed and providing a patterned electrically conductive polymer film.

When a porous polymer film is used, the resultant patterned electrically conductive polymer film has a uniform thickness.

When an electrochemical polymer of an aromatic compound is mixed in a surface layer of the polymer film, electrochemical polymerization can be performed using the obtained sheet. More particularly, electrodes shown in FIG. 1A or 2 may be brought into tight contact with two surfaces of the polymer film, and a voltage is applied therebetween to perform electrochemical polymerization of the aromatic compound. In this manner, the film has a high conductivity on the surface thereof.

What is claimed is:

1. A method of manufacturing a polymer film with a conductive pattern, comprising the steps of:
   forming an insulating polymer film over a patterned electrode surface;
   contacting said insulating polymer film with an electrolytic solution containing an aromatic compound to permit said aromatic compound to diffuse through said insulating polymer film to the interface between said insulating polymer film and said patterned electrode surface; and
   applying an electric current across said insulating polymer film to polymerize said aromatic compound at said interface and thereby form an electrically conductive pattern of polymerized aromatic compound extending from said interface into the bulk of said insulating polymer film.

2. A method according to claim 1, wherein said patterned electrode surface includes an electrically conductive pattern.

3. A method according to claim 1, wherein said insulating polymer film is a material selected from the group consisting of a polyvinyl chloride resin, a polyvinylidene chloride resin, a polyvinylidene fluoride resin, a polystyrene resin, an acrylic resin, polycarbazone, a polymer of vinyl carbazole with other vinyl monomer, a copolymer of ethylene with other vinyl monomer, polyvinyl acetate, a copolymer of vinyl acetate with other vinyl monomer, other polyvinyl alcohol, other polycarbonate, polyetherimide, other polyethersulfonate, other polyamide-imide, other nylon, other phenol resin, other polybutadiene rubber, ethyl cellulose, cellulose acetate, and cellulose nitrate.

4. A method according to claim 3, wherein said polymer film is added with an additive selected from the group consisting of a plasticizer, a heat stabilizer, a lubricant, an ultraviolet absorber, a defogger, a pigment, a dye, a surfactant, and an electrically conductive filler.

5. A method according to claim 1, wherein said insulating polymer film comprises a multilayer film having at least two laminated polymer films.

6. A method according to claim 1, wherein said electrolytic solution includes a material selected from the group consisting of an organic quaternary ammonium salt, protonic acid and an inorganic salt.

7. A method according to claim 6, wherein said electrolytic solution includes a solvent for dissolving the aromatic compound selected from the group consisting of acetonitrile, benzonitrile and propylene carbonate electrolytes.

8. A method according to claim 1, wherein said patterned electrode surface comprises an electrically conductive layer formed on a substrate and an insulating pattern to be transferred to said insulating polymer film.

9. A method according to claim 1, wherein said patterned electrode surface comprises an electrically conductive pattern formed on a substrate.

10. A method according to claim 1, wherein said patterned electrode surface includes a layer whose electrical resistance is changed upon radiation of light, said layer being exposed with light during said step of applying in accordance with a pattern to be formed in said layer.

11. A method according to claim 1, wherein the step of forming said electrically conductive aromatic compound area in said polymer film includes the steps of: forming an electrochemical polymer by electrochemically polymerizing the aromatic compound; contacting said insulating polymer film with said electrochemical polymer; and mixing said electrochemical polymer in said polymer film by electrochemically polymerizing said aromatic compound on said electrode with said polymer film.

12. A polymer film fabricated according to the method of any one of claims 1–11.

* * * * *